(12) United States Patent
Palanki et al.

(10) Patent No.: US 7,974,362 B2
(45) Date of Patent: Jul. 5, 2011

(54) METHOD AND APPARATUS FOR GENERATING A PERMUTATION FOR REVERSE LINK HOPPING IN WIRELESS COMMUNICATION SYSTEM

(75) Inventors: Ravi Palanki, San Diego, CA (US); Aamod Khandekar, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 456 days.

(21) Appl. No.: 12/091,432

(22) PCT Filed: Oct. 27, 2006

(86) PCT No.: PCT/US2006/041924
§ 371 (c)(1),
(2), (4) Date: Oct. 6, 2008

(87) PCT Pub. No.: WO2007/050840
PCT Pub. Date: May 3, 2007

(65) Prior Publication Data
US 2009/0147828 A1    Jun. 11, 2009

Related U.S. Application Data

(60) Provisional application No. 60/731,128, filed on Oct. 27, 2005.

(51) Int. Cl.
*H04L 27/00* (2006.01)
(52) U.S. Cl. ........ 375/295; 375/132; 375/133; 375/135; 375/260
(58) Field of Classification Search .......... 375/130–137, 375/260, 295
See application file for complete search history.

(56) References Cited

U.S. PATENT DOCUMENTS 6,934,388 B1 * 8/2005 Clark .............................. 380/47
2007/0160115 A1 * 7/2007 Palanki et al. ................ 375/132
* cited by examiner

*Primary Examiner* — Curtis B Odom
(74) *Attorney, Agent, or Firm* — Turocy & Watson, LLP

(57) ABSTRACT

A method and apparatus for generating a permutation for reverse link hopping is provided, comprising initializing permutation constants, determining a value for p such that $i<2^p$ wherein i is a value of a first counter, initializing a second counter j to '0', setting x to i+1 wherein x is index of elements of an array A, clocking a Pseudo-noise (PN) register n times to generate a pseudorandom number, setting x to p Least Significant Bits (LSB) of the pseudorandom number, incrementing j by 1, determining if j is equal to 3 or x is less than or equal to i, determining if x is greater than i, setting x equal to x–i, swapping the $i^{th}$ and $x^{th}$ element in the array A, decrementing counter i by 1, and mapping a set of hop-ports to a set of sub-carriers based upon the generated hop-permutation.

11 Claims, 5 Drawing Sheets

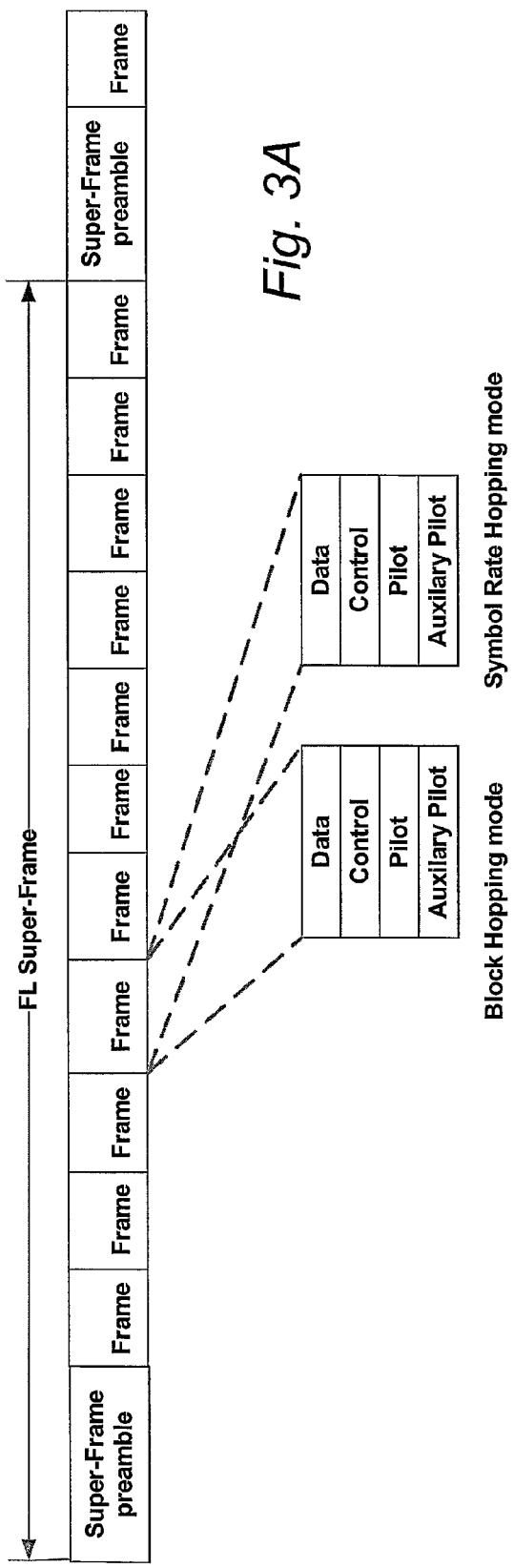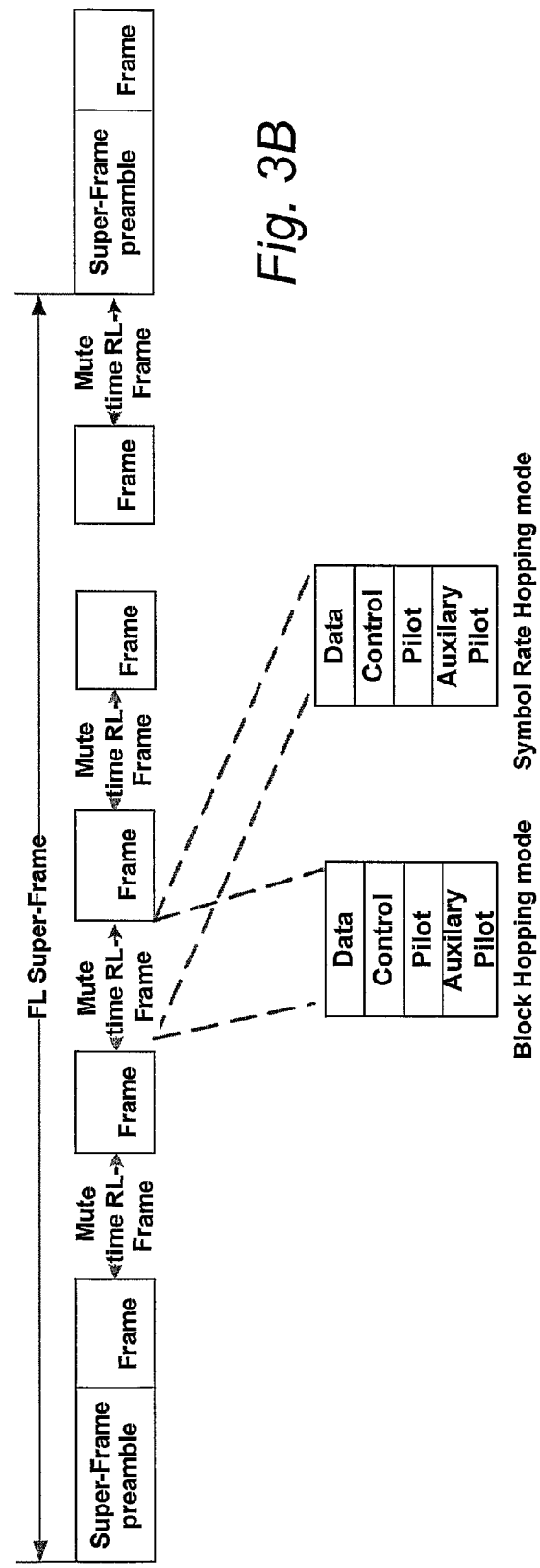

METHOD AND APPARATUS FOR GENERATING A PERMUTATION FOR REVERSE LINK HOPPING IN WIRELESS COMMUNICATION SYSTEM

CLAIM OF PRIORITY UNDER 35 U.S.C. §119

The present application for patent claims priority to Provisional Application Ser. No. 60/731,128, entitled "WIRELESS COMMUNICATION", filed Oct. 27, 2005, assigned to the assignee hereof, and expressly incorporated herein by reference.

BACKGROUND

1. Field

The present disclosure relates generally to wireless communication and more particularly to methods and apparatus for generating a permutation for reverse link hopping.

2. Background

Wireless communication systems have become a prevalent means by which a majority of people worldwide have come to communicate. Wireless communication devices have become smaller and more powerful in order to meet consumer needs and to improve portability and convenience. The increase in processing power in mobile devices such as cellular telephones has lead to an increase in demands on wireless network transmission systems. Such systems typically are not as easily updated as the cellular devices that communicate there over. As mobile device capabilities expand, it can be difficult to maintain an older wireless network system in a manner that facilitates fully exploiting new and improved wireless device capabilities.

Wireless communication systems generally utilize different approaches to generate transmission resources in the form of channels. These systems may be code division multiplexing (CDM) systems, frequency division multiplexing (FDM) systems, and time division multiplexing (TDM) systems. One commonly utilized variant of FDM is orthogonal frequency division multiplexing (OFDM) that effectively partitions the overall system bandwidth into multiple orthogonal subcarriers. These subcarriers may also be referred to as tones, bins, and frequency channels. Each subcarrier can be modulated with data. With time division based techniques, each subcarrier can comprise a portion of sequential time slices or time slots. Each user may be provided with a one or more time slot and subcarrier combinations for transmitting and receiving information in a defined burst period or frame. The hopping schemes may generally be a symbol rate hopping scheme or a block hopping scheme.

Code division based techniques typically transmit data over a number of frequencies available at any time in a range. In general, data is digitized and spread over available bandwidth, wherein multiple users can be overlaid on the channel and respective users can be assigned a unique sequence code. Users can transmit in the same wide-band chunk of spectrum, wherein each user's signal is spread over the entire bandwidth by its respective unique spreading code. This technique can provide for sharing, wherein one or more users can concurrently transmit and receive. Such sharing can be achieved through spread spectrum digital modulation, wherein a user's stream of bits is encoded and spread across a very wide channel in a pseudo-random fashion. The receiver is designed to recognize the associated unique sequence code and undo the randomization in order to collect the bits for a particular user in a coherent manner.

A typical wireless communication network (e.g., employing frequency, time, and/or code division techniques) includes one or more base stations that provide a coverage area and one or more mobile (e.g., wireless) terminals that can transmit and receive data within the coverage area. A typical base station can simultaneously transmit multiple data streams for broadcast, multicast, and/or unicast services, wherein a data stream is a stream of data that can be of independent reception interest to a mobile terminal. A mobile terminal within the coverage area of that base station can be interested in receiving one, more than one or all the data streams transmitted from the base station. Likewise, a mobile terminal can transmit data to the base station or another mobile terminal. In these systems the bandwidth and other system resources are assigned utilizing a scheduler.

The signals, signal formats, signal exchanges, methods, processes, and techniques disclosed herein provide several advantages over known approaches. These include, for example, reduced signaling overhead, improved system throughput, increased signaling flexibility, reduced information processing, reduced transmission bandwidth, reduced bit processing, increased robustness, improved efficiency, and reduced transmission power

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

According to an embodiment, a method is provided for generating a permutation for reverse link hopping, the method comprising initializing permutation constants, determining a value for p such that $i<2^p$ wherein i is a value of a first counter, initializing a second counter j to '0', setting x to i+1 wherein x is index of elements of an array A, clocking a Pseudo-noise (PN) register n times to generate a pseudorandom number, setting x to p Least Significant Bits (LSB) of the pseudorandom number, incrementing j by 1, determining if x is greater than i, setting x equal to x−i if x is greater than i, swapping the $i^{th}$ and $x^{th}$ element in the array A, decrementing counter i by 1, and mapping a set of hop-ports to a set of sub-carriers based upon the generated hop-permutation.

According to another embodiment, a computer readable medium is described having a first set of instructions for initializing permutation constants, a second set of instructions for determining a value for p such that $i<2^p$ wherein i is a value of a first counter, a third set of instructions for initializing a second counter j to '0', a fourth set of instructions for setting x to i+1 wherein x is index of elements of an array A, a fifth set of instructions for clocking a Pseudo-noise (PN) register n times to generate a pseudorandom number, a sixth set of instructions for setting x to p Least Significant Bits (LSB) of the pseudorandom number, a seventh set of instructions for incrementing j by 1, an eighth set of instructions for determining if x is greater than i, a ninth set of instructions for setting x equal to x−i if x is greater than i, a tenth set of instructions for swapping the $i^{th}$ and $x^{th}$ element in the array A, an eleventh set of instructions for decrementing counter i by 1, and a twelfth set of instructions for mapping a set of hop-ports to a set of sub-carriers based upon the generated hop-permutation.

According to yet another embodiment, an apparatus operable in a wireless communication system is described which includes means for initializing permutation constants, means for determining a value for p such that $i<2^p$ wherein i is a value of a first counter, means for initializing a second counter j to '0', means for setting x to i+1 wherein x is index of elements of an array A, means for clocking a Pseudo-noise (PN) register n times to generate a pseudorandom number, means for setting x to p Least Significant Bits (LSB) of the pseudorandom number, means for incrementing j by 1, means for determining if x is greater than i, means for setting x equal to x−i if x is greater than i, means for swapping the $i^{th}$ and $x^{th}$ element in the array A, means for decrementing counter i by 1, and means for mapping a set of hop-ports to a set of sub-carriers based upon the generated hop-permutation.

To the accomplishment of the foregoing and related ends, the one or more aspects comprise the features hereinafter fully described and particularly pointed out in the claims. The following description and the annexed drawings set forth in detail certain illustrative aspects of the one or more aspects. These aspects are indicative, however, of but a few of the various ways in which the principles of various aspects may be employed and the described aspects are intended to include all such aspects and their equivalents.

BRIEF DESCRIPTION OF THE DRAWINGS

FIGS. 3A and 3B illustrate aspects of superframe structures for a multiple access wireless communication system;

DETAILED DESCRIPTION

Figure 1:
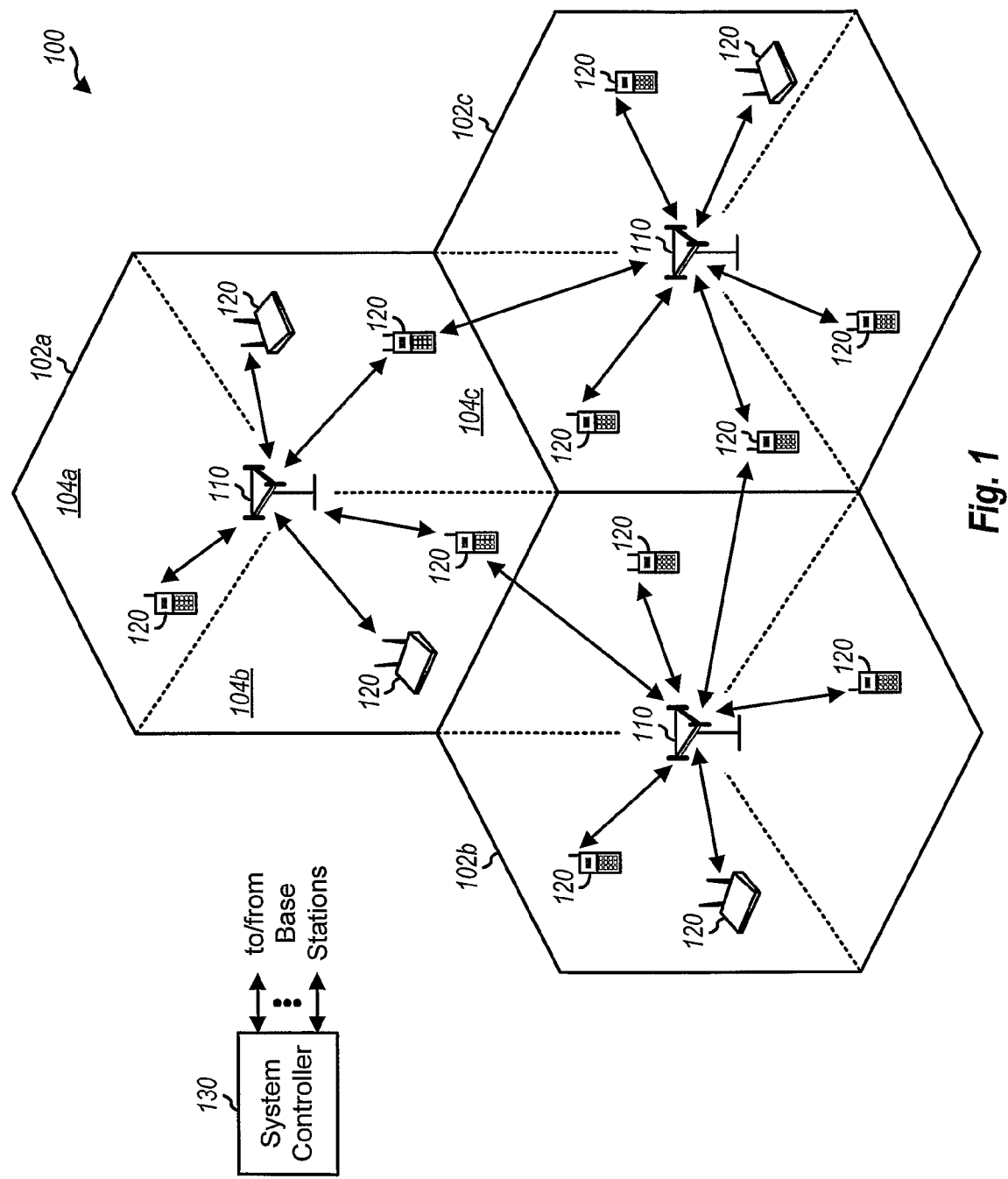
FIG. 1 illustrates aspects of a multiple access wireless communication system.

Various aspects are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Referring to FIG. 1, a multiple access wireless communication system according to one aspect is illustrated. A multiple access wireless communication system 100 includes multiple cells, e.g. cells 102, 104, and 106. In the aspect of FIG. 1, each cell 102, 104, and 106 may include an access point 150 that includes multiple sectors. The multiple sectors are formed by groups of antennas each responsible for communication with access terminals in a portion of the cell. In cell 102, antenna groups 112, 114, and 116 each correspond to a different sector. In cell 104, antenna groups 118, 120, and 122 each correspond to a different sector. In cell 106, antenna groups 124, 126, and 128 each correspond to a different sector.

Each cell includes several access terminals which are in communication with one or more sectors of each access point. For example, access terminals 130 and 132 are in communication base 142, access terminals 134 and 136 are in communication with access point 144, and access terminals 138 and 140 are in communication with access point 146.

Controller 130 is coupled to each of the cells 102, 104, and 106. Controller 130 may contain one or more connections to multiple networks, e.g. the Internet, other packet based networks, or circuit switched voice networks that provide information to, and from, the access terminals in communication with the cells of the multiple access wireless communication system 100. The controller 130 includes, or is coupled with, a scheduler that schedules transmission from and to access terminals. In other aspects, the scheduler may reside in each individual cell, each sector of a cell, or a combination thereof.

As used herein, an access point may be a fixed station used for communicating with the terminals and may also be referred to as, and include some or all the functionality of, a base station, a Node B, or some other terminology. An access terminal may also be referred to as, and include some or all the functionality of, a user equipment (UE), a wireless communication device, terminal, a mobile station or some other terminology.

It should be noted that while FIG. 1, depicts Physical sectors, i.e. having different antenna groups for different sectors, other approaches may be utilized. For example, utilizing multiple fixed "beams" that each cover different areas of the cell in frequency space may be utilized in lieu of, or in combination with Physical sectors. Such an approach is depicted and disclosed in co-pending U.S. patent application Ser. No. 11/260,895, entitled "Adaptive Sectorization in Cellular System."

Figure 2:
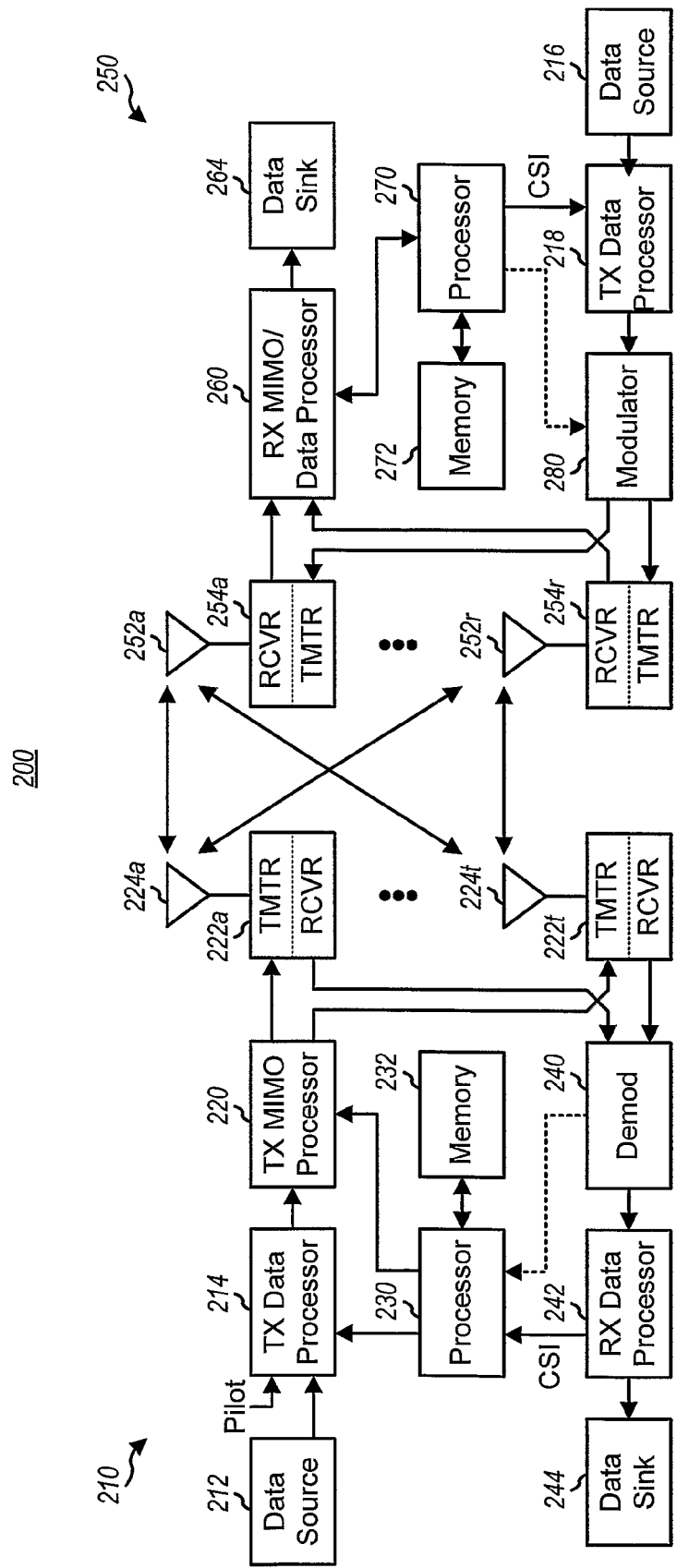
FIG. 2 illustrates aspects of a transmitter and receiver in a multiple access wireless communication system.

Referring to FIG. 2, a block diagram of an aspect of a transmitter system 210 and a receiver system 250 in a MIMO system 200 is illustrated. At transmitter system 210, traffic data for a number of data streams is provided from a data source 212 to transmit (TX) data processor 214. In an aspect, each data stream is transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM, or other orthogonalization or non-orthogonalization techniques. The pilot data is typically a known data pattern that is processed in a known manner and may be used at the receiver system to estimate the channel response. The multiplexed pilot and coded data for each data stream is then modulated (i.e., symbol mapped) based on one or more particular modulation schemes (e.g., BPSK, QSPK, M-PSK, or M-QAM) selected for that data stream to provide modulation symbols. The data rate, coding, and modulation for each data stream may be determined by instructions performed on provided by processor 230.

The modulation symbols for all data streams are then provided to a TX processor 220, which may further process the modulation symbols (e.g., for OFDM). TX processor 220 then provides $N_T$ modulation symbol streams to $N_T$ transmitters (TMTR) 222a through 222t. Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals are received by $N_R$ antennas 252a through 252r and the received signal from each antenna 252 is provided to a respective receiver (RCVR) 254. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The processing by RX data processor 260 is described in further detail below. Each detected symbol stream includes symbols that are estimates of the modulation symbols transmitted for the corresponding data stream. RX data processor 260 then demodulates, deinterleaves, and decodes each detected symbol stream to recover the traffic data for the data stream. The processing by RX data processor 218 is complementary to that performed by TX processor 220 and TX data processor 214 at transmitter system 210.

RX data processor 260 may be limited in the number of subcarriers that it may simultaneously demodulate, e.g. 512 subcarriers or 5 MHz, and such a receiver should be scheduled on a single carrier. This limitation may be a function of its FFT range, e.g. sample rates at which the processor 260 may operate, the memory available for FFT, or other functions available for demodulation. Further, the greater the number of subcarriers utilized, the greater the expense of the access terminal.

The channel response estimate generated by RX processor 260 may be used to perform space, space/time processing at the receiver, adjust power levels, change modulation rates or schemes, or other actions. RX processor 260 may further estimate the signal-to-noise-and-interference ratios (SNRs) of the detected symbol streams, and possibly other channel characteristics, and provides these quantities to a processor 270. RX data processor 260 or processor 270 may further derive an estimate of the "operating" SNR for the system. Processor 270 then provides channel state information (CSI), which may comprise various types of information regarding the communication link and/or the received data stream. For example, the CSI may comprise only the operating SNR. In other aspects, the CSI may comprise a channel quality indicator (CQI), which may be a numerical value indicative of one or more channel conditions. The CSI is then processed by a TX data processor 278, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to recover the CSI reported by the receiver system. The reported CSI is then provided to processor 230 and used to (1) determine the data rates and coding and modulation schemes to be used for the data streams and (2) generate various controls for TX data processor 214 and TX processor 220. Alternatively, the CSI may be utilized by processor 270 to determine modulation schemes and/or coding rates for transmission, along with other information. This may then be provided to the transmitter which uses this information, which may be quantized, to provide later transmissions to the receiver.

Processors 230 and 270 direct the operation at the transmitter and receiver systems, respectively. Memories 232 and 272 provide storage for program codes and data used by processors 230 and 270, respectively.

At the receiver, various processing techniques may be used to process the $N_R$ NR received signals to detect the $N_T$ transmitted symbol streams. These receiver processing techniques may be grouped into two primary categories (i) spatial and space-time receiver processing techniques (which are also referred to as equalization techniques); and (ii) "successive nulling/equalization and interference cancellation" receiver processing technique (which is also referred to as "successive interference cancellation" or "successive cancellation" receiver processing technique).

While FIG. 2 discusses a MIMO system, the same system may be applied to a multi-input single-output system where multiple transmit antennas, e.g. those on a base station, transmit one or more symbol streams to a single antenna device, e.g. a mobile station. Also, a single output to single input antenna system may be utilized in the same manner as described with respect to FIG. 2.

The transmission techniques described herein may be implemented by various means. For example, these techniques may be implemented in hardware, firmware, software, or a combination thereof. For a hardware implementation, the processing units at a transmitter may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. The processing units at a receiver may also be implemented within one or more ASICs, DSPs, processors, and so on.

For a software implementation, the transmission techniques may be implemented with modules (e.g., procedures, functions, and so on) that perform the functions described herein. The software codes may be stored in a memory (e.g., memory 230, 272x or 272y in FIG. 2) and executed by a processor (e.g., processor 232, 270x or 270y). The memory may be implemented within the processor or external to the processor.

It should be noted that the concept of channels herein refers to information or transmission types that may be transmitted by the access point or access terminal. It does not require or utilize fixed or predetermined blocks of subcarriers, time periods, or other resources dedicated to such transmissions.

Referring to FIGS. 3A and 3B, aspects of superframe structures for a multiple access wireless communication system are illustrated. FIG. 3A illustrates aspects of superframe structures for a frequency division duplexed (FDD) multiple access wireless communication system, while FIG. 3B illustrates aspects of superframe structures for a time division duplexed (TDD) multiple access wireless communication system. The superframe preamble may be transmitted separately for each carrier or may span all of the carriers of the sector.

In both FIGS. 3A and 3B, the forward link transmission is divided into units of superframes. A superframe may consist of a superframe preamble followed by a series of frames. In an FDD system, the reverse link and the forward link transmission may occupy different frequency bandwidths so that transmissions on the links do not, or for the most part do not, overlap on any frequency subcarriers. In a TDD system, N forward link frames and M reverse link frames define the number of sequential forward link and reverse link frames that may be continuously transmitted prior to allowing transmission of the opposite type of frame. It should be noted that the number of N and M may be vary within a given superframe or between superframes.

In both FDD and TDD systems each superframe may comprise a superframe preamble. In certain aspects, the superframe preamble includes a pilot channel that includes pilots that may be used for channel estimation by access terminals, a broadcast channel that includes configuration information that the access terminal may utilize to demodulate the information contained in the forward link frame. Further acquisition information such as timing and other information sufficient for an access terminal to communicate on one of the carriers and basic power control or offset information may also be included in the superframe preamble. In other cases, only some of the above and/or other information may be included in this superframe preamble.

As shown in FIGS. 3A and 3B, the superframe preamble is followed by a sequence of frames. Each frame may consist of a same or a different number of OFDM symbols, which may constitute a number of subcarriers that may simultaneously utilized for transmission over some defined period. Further, each frame may operate according to a symbol rate hopping mode, where one or more non-contiguous OFDM symbols are assigned to a user on a forward link or reverse link, or a block hopping mode, where users hop within a block of OFDM symbols. The actual blocks or OFDM symbols may or may not hop between frames.

An access terminal and an access network communicate with each other using a communication link Based upon predetermined timing, system conditions, or other decision criteria, the access terminal and the access network communicate with each other. The communication link may be implemented using communication protocols/standards such as World Interoperability for Microwave Access (WiMAX), infrared protocols such as Infrared Data Association (IrDA), short-range wireless protocols/technologies, Bluetooth® technology, ZigBee® protocol, ultra wide band (UWB) protocol, home radio frequency (HomeRF), shared wireless access protocol (SWAP), wideband technology such as a wireless Ethernet compatibility alliance (WECA), wireless fidelity alliance (Wi-Fi Alliance), 802.11 network technology, public switched telephone network technology, public heterogeneous communications network technology such as the Internet, private wireless communications network, land mobile radio network, code division multiple access (CDMA), wideband code division multiple access (WCDMA), universal mobile telecommunications system (UMTS), advanced mobile phone service (AMPS), time division multiple access (TDMA), frequency division multiple access (FDMA), orthogonal frequency division multiple (OFDM), orthogonal frequency division multiple access (OFDMA), orthogonal frequency division multiple FLASH (OPDM-FLASH), global system for mobile communications (GSM), single carrier (1×) radio transmission technology (RTT), evolution data only (EV-DO) technology, general packet radio service (GPRS), enhanced data GSM environment (EDGE), high speed downlink data packet access (HSPDA), analog and digital satellite systems, and any other technologies/protocols that may be used in at least one of a wireless communications network and a data communications network.

The hopping sequence is described as a mapping from the set of hop-ports to a set of sub-carriers. The reverse link implements block hopping. In this scheme, the set of non-guard hop-ports may be divided into groups of $N_{BLOCK}$ consecutive hop-ports, each of which is denoted as a block. The hop-permutation will map a block of hop-ports to a group of subcarriers with consecutive indices. This group of subcarriers may also be referred to as a block. Furthermore, the hop permutation will remain constant for the duration of Reverse Link Physical Layer (RL PHY) frames. In this design, therefore a group of hop-ports spanning a RL PHY frame worth of Orthogonal Frequency Division Multiplexing (OFDM) symbols in time and $N_{BLOCK}$ hop-ports in hop-port space are mapped to neighbouring tones in the time-frequency grid. This group of $N_{BLOCK} N_{FRAME,R}$ hop-ports may be referred to as tile for all RL PHY frames except those with index 0 in Frequency Division Duplex (FDD) mode. RL PHY frames with index 0 within a superframe span ($N_{FRAME,R}$+ $N_{PREAMBLE}$) OFDM symbols in FDD mode. For these RL PHY frames, the group of $N_{BLOCK}$ ($N_{FRAME,R}+N_{PREAMBLE}$) hop-ports may be referred to as tile.

Some of the permutations used for RL hopping may be generated using a common permutation generation algorithm, which is as described below. The permutation algorithm takes a 20-bit seed and a permutation size M as inputs and outputs a permutation of the set {0, 1, . . . , M−1}. The algorithm may use a linear feedback shift register to generate pseudorandom numbers, which in turn are used to generate pseudorandom permutations.

The common permutation generation algorithm may generate a permutation of size M. The initialization steps of the algorithm includes assuming an integer n such that $M \leq 2^n$. Then an array A of size M is initialized with numbers 0, 1, 2 . . . M−1. A PN register is further initialized with a 20 bit seed and a counter i is initialized to M−1. The algorithm further comprises repeating steps of finding a smallest p such that $i<2^p$, initializing a counter j to 0, setting x to i+1, clocking the PN register n times to generate a pseudorandom number, setting x to p LSBs of that number, incrementing j by 1, repeating the steps of clocking the PN register and incrementing the value of j until j=3 or $x \leq i$, setting x=x−i if x>i, swapping the $i^{th}$ and $x^{th}$ elements in array A and decrementing counter i by 1 until i=0. The resulting array A is the output permutation P.

Figure 4A:
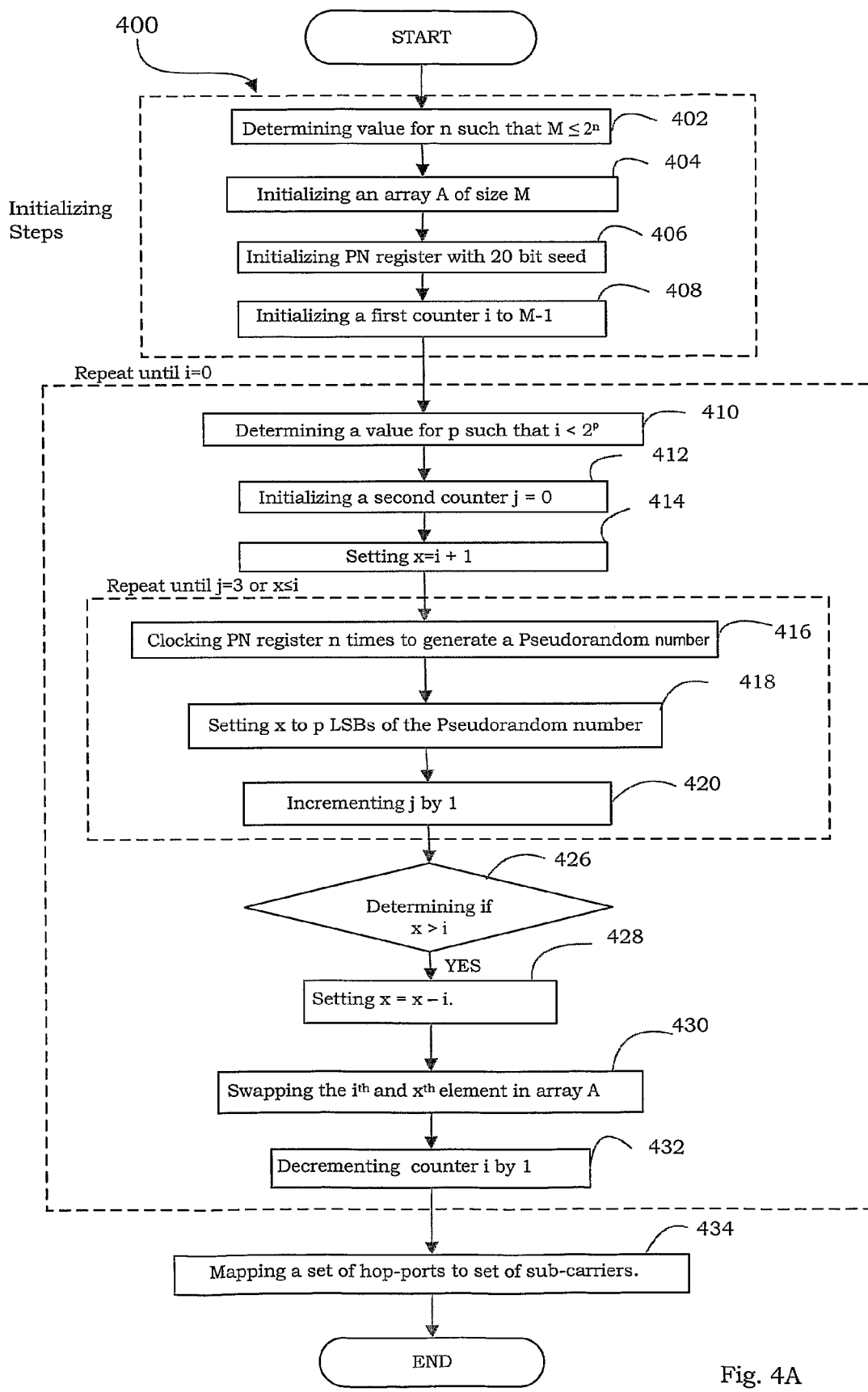
FIG. 4A illustrates a flow diagram of a process used by an access terminal.

FIG. 4A illustrates a flow diagram of process 400, according to an embodiment. At 402, a value for an integer n is determined such that $M \leq 2^n$. At 404, an array A of size M is initialized. At 406, a pseudo-noise (PN) register is initialized with a 20 bit seed. At 408, a first counter i is initialized to M−1. At 410, a value for an integer p is determined such that $i<2^p$. At 412, a second counter j is initialized to '0'. At 414, an integer x is set to value i+1. At 416, the PN register is clocked n times to generate a pseudorandom number. At 418, x is set to p LSBs of the pseudorandom number. At 420, the value of j is incremented by 1. The process at 416, 418 and 420 is repeated until it is not determined that j=3 or $x \leq i$. Further, at 426 it is determined whether x>i. At 428, the value of x is set to x−i, if x is greater than i. At 430, the $i^{th}$ and $x^{th}$ element in the array A are swapped. At 432, counter i is decremented by 1. The process at 410, 412, 414, 416, 418, 420, 426, 428, 430 and 432 is repeated until it is not determined that i='0'. At 434, a set of hop-ports is mapped to a set of sub-carriers based upon the generated hop-permutation.

Figure 4B:
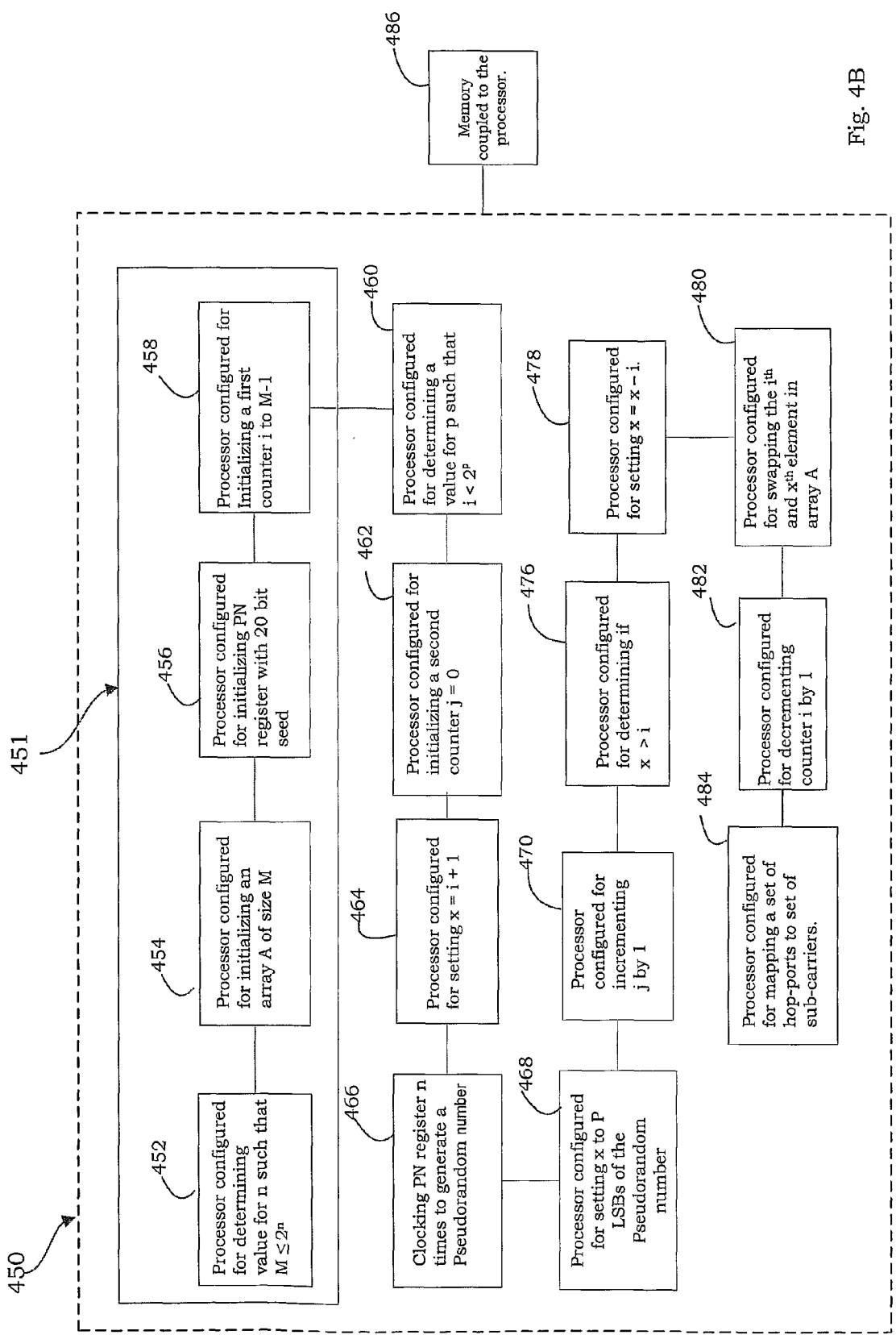
FIG. 4B illustrates one or more processors configured for generating a permutation for reverse link hopping.

FIG. 4B illustrates a processor 450 for generating a permutation for reverse link hopping. The processor referred to may be electronic devices and may comprise one or more processors configured to generate the permutation. A processor 451 is configured for initializing permutation constants. The processor 451 may comprise a processor 452 for determining a value for an integer n such that $M \leq 2^n$, a processor 454 for initializing an array A of size M, a processor 456 for initializing a pseudo-noise (PN) register with a 20 bit seed and a processor 458 for initializing a first counter i to M−1. Processor 460 is configured to determine a value for the integer p such that $i<2^p$. Processor 462 is configured to initialize a second counter j to '0'. Processor 464 is configured to set x to a value i+1. Processor 466 is configured to clock the PN register n times to generate the pseudorandom number. Processor 468 is configured to set x to p LSBs of the pseudorandom number. Processor 470 is configured to increment the value of j by 1. A processor is configured to repeat the clocking of the PN register n times to generate pseudorandom number, setting x to the p LSBs of the pseudorandom number, and incrementing j by 1 until it is not determined that j=3 or x≦i. Further, processor 476 is configured to determine whether x>i. Processor 478 is configured to set value of x to x−i, if x is greater than i. Processor 480 is configured to swap the $i^{th}$ and $x^{th}$ element in the array A. Processor 482 is configured to decrement counter i by 1. Further, a processor is configured to repeat determining the value for p such that $i<2^p$, initializing the second counter j=0, setting x to i+1, clocking the PN register n times to generate the pseudorandom number, setting x to the p LSBs of the pseudorandom number, incrementing j by 1, determining if x>i, setting x to x−i, if x is greater than i, swapping the $i^{th}$ and $x^{th}$ element in the array A and decrementing the counter i by 1, until it is not determined that i='0'. A processor 484 is configured to map a set of hop-ports to a set of subcarriers based on the generated hop-permutation. The functionality of the discrete processors 452 to 484 depicted in the figure may be combined into a single processor 450. A memory 486 is also coupled to the processor 450.

In an embodiment, an apparatus is described which comprises means for initializing permutation constants. The means for initializing may further comprise a means for determining a value for an integer n such that $M \leq 2^n$, a means for initializing an array A of size M, a means for initializing a pseudo-noise (PN) register with a 20 bit seed, and a means for initializing a first counter i to M−1. The apparatus further comprises a means for determining a value for the integer p such that $i<2^p$, means for initializing a second counter j to '0', means for setting x to a value i+1, means for clocking the PN register n times to generate the pseudorandom number, means for setting x to p LSBs of the pseudorandom number and means for incrementing the value of j by 1. A means is provided for repeating the clocking of the PN register n times to generate pseudorandom number, setting x to the p LSBs of the pseudorandom number, and incrementing j by 1 until it is not determined that j=3 or x≦i. Further, a means is provided for determining whether x>i and means for setting value of x to x−i, if x is greater than i. The apparatus further comprises a means for swapping the $i^{th}$ and $x^{th}$ element in the array A, means for decrementing counter i by 1, means for repeating determining the value for p such that $i<2^p$, initializing the second counter j=0, setting x to i+1, clocking the PN register n times to generate the pseudorandom number, setting x to the p LSBs of the pseudorandom number, incrementing j by 1, determining if x>i, setting x to x−i, if x is greater than i, swapping the $i^{th}$ and $x^{th}$ element in the array A and decrementing the counter i by 1, until it is not determined that i='0. A means is also provided for mapping a set of hop-ports to a set of subcarriers based on the generated hop-permutation. The means described herein may comprise one or more processors.

Furthermore, embodiments may be implemented by hardware, software, firmware, middleware, microcode, or any combination thereof. When implemented in software, firmware, middleware or microcode, the program code or code segments to perform the necessary tasks may be stored in a machine readable medium such as a separate storage(s) not shown. A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Various modifications to these aspects will be readily apparent to those skilled in the art, and the generic principles defined herein may be applied to other aspects. Thus, the description is not intended to be limited to the aspects shown herein but is to be accorded the widest scope consistent with the principles and novel features disclosed herein.

We claim:

1. A method for generation of permutation for reverse link hopping in a wireless communication system, comprising:
   initializing permutation constants, comprising:
      determining an integer n wherein M is less than or equal to $2^n$;
      initializing an array A of size M;
      initializing a pseudonoise (PN) register with a seed; and
      initializing a first counter i to M−1;
   performing a first set of operations, including:
      determining a value for an integer p wherein i is less than $2^p$;
      initializing a second counter j to 0;
      setting an integer x to i+1, wherein x is an index of elements of an array A;
      performing a second set of operations, including:
         clocking the PN register n times to generate a pseudorandom number;
         setting x to p Least Significant Bits (LSB) of the pseudorandom number; and
         incrementing j by 1;
      repeating the performing the second set of operations until j is equal to 3 or x is less than or equal to i;
      determining whether x is greater than i;
      setting x equal to x−i if x is greater than i;
      swapping the $i^{th}$ and the $x^{th}$ element in the array A; and
      decrementing i by 1;
   repeating the performing the first set of operations until i is equal to 0; and
   generating a hop permutation by mapping a set of hop-ports to a set of sub-carriers based on the array A.

2. A non-transitory computer readable medium having stored thereon instructions that cause a computer to execute a process, the process comprising:
   initializing permutation constants, comprising:
      determining an integer n such that M is less than or equal to $2^n$;
      initializing an array A of size M;
      initializing a pseudonoise (PN) register with a seed; and
      initializing a first counter i to M−1;
   performing a first set of operations, including:
      determining a value for an integer p such that i is less than $2^p$;
      initializing a second counter j to 0;
      setting an integer x to i+1, wherein x is index of elements of an array A;
      performing a second set of operations, including:
         clocking the PN register n times to generate a pseudorandom number;
         setting x to p Least Significant Bits (LSB) of the pseudorandom number;
         incrementing j by 1;
      repeating the performing the second set of operations until j is equal to 3 or x is less than or equal to i;
      determining whether x is greater than;
      setting x equal to x−i if x is greater than i;
      swapping the $i^{th}$ and $x^{th}$ element in the array A;

decrementing i by 1; and
repeating the performing the first set of operations until i is equal to 0;
generating a hop permutation for reverse link (RL) hopping by mapping a set of hop-ports to a set of sub-carriers based on array A.

3. An apparatus, comprising:
means for initializing permutation constants, the permutation constants comprising:
an integer n such that M is less than or equal to $2^n$;
an array A of size M;
a pseudorandom number (PN) register with a seed; and
a first counter i initialized to M−1;
means for performing a first set of operations, including:
determining a value for p such that i is less than $2^{p-}$;
initializing a second counter j to 0;
setting integer x to i+1, wherein x is index of elements of the array A;
performing a second set of operations, including:
clocking the PN register n times to generate a pseudorandom number;
setting x to p Least Significant Bits (LSB) of the pseudorandom number;
incrementing i by 1;
repeating the performing the second set of operations until j is equal to 3 or x is less than or equal to i;
determining if x is greater than i;
setting x equal to x−i, if x is greater than i;
swapping the $i^{th}$ and $x^{th}$ element in the array A;
decrementing i by 1; and
repeating the performing the first set of operations until i is equal to 0; and
means for mapping a set of hop-ports for reverse link (RL) hopping to a set of sub-carriers based upon array A.

4. The apparatus of claim 3, wherein the seed is a 20 bit seed.

5. The apparatus of claim 3, wherein the PN register is a linear feedback shift register.

6. The apparatus of claim 5, wherein the linear feedback shift resistor generates pseudorandom numbers.

7. The apparatus of claim 3, wherein means for mapping back hops the set of hop-ports to the set of sub-carriers.

8. The apparatus of claim 3, wherein the set of hop-ports is a block of hop-ports.

9. The apparatus of claim 3, wherein the means for mapping maps the set of hop ports to the set of sub-carriers with consecutive indices.

10. The apparatus of claim 3, wherein the hop permutation remains constant for a duration of one or more Reverse Link Physical Layer (RL PHY) frames.

11. A system, comprising:
a first processor configured to initialize permutation constants, the permutation constants comprising:
an integer n such that M is less than or equal to $2^n$;
an array A of size M;
a pseudorandom number (PN) register with a seed; and
a first counter i initialized to M−1;
a second processor configured to perform a first set of operations, including:
determining a value for p such that i is less than $2^p$;
initializing a second counter j to 0;
setting integer x to i+1, wherein x is an index of elements of the array A;
performing a second set of operations, including:
clocking the PN register n times to generate a pseudorandom number;
setting x to p Least Significant Bits (LSB) of the pseudorandom number;
incrementing j by 1;
repeating the performing the second set of operations until j is equal to 3 or x is less than or equal to i;
determining if x is greater than i;
setting x equal to x−i, if x is greater than i;
swapping the $i^{th}$ and $x^{th}$ element in the array A;
decrementing i by 1; and
repeating the performing the first set of operations until i is equal to 0; and
a third processor configured to map a set of hop-ports for reverse link hopping to a set of sub-carriers based upon array A.

* * * * *